(12) United States Patent
Inuzuka et al.

(10) Patent No.: US 6,559,480 B1
(45) Date of Patent: May 6, 2003

(54) SEMICONDUCTOR DEVICE SUCH AS A HALL-EFFECT SENSOR OR SOLAR CELL BARRIER LAYER FOR CONTROLLING CURRENT FLOW TO SUBSTRATE

(75) Inventors: Hajime Inuzuka, Nishio (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 08/216,517

(22) Filed: Mar. 23, 1994

Related U.S. Application Data

(63) Continuation of application No. 07/002,550, filed on Jan. 13, 1987, now Pat. No. 4,754,886, which is a continuation of application No. 07/905,142, filed on Jun. 23, 1992, now abandoned, which is a continuation of application No. 07/469,473, filed on Mar. 29, 1990, now abandoned.

(30) Foreign Application Priority Data

Oct. 5, 1988 (JP) .......................................... 63-251395

(51) Int. Cl.$^7$ ...................... H01L 33/00; H01L 31/0328
(52) U.S. Cl. ........................................ 257/103; 257/190
(58) Field of Search ................................ 257/103, 190

(56) References Cited

U.S. PATENT DOCUMENTS

| | | | | |
|---|---|---|---|---|
| 4,315,273 A | * | 2/1982 | Yamamoto et al. | 357/27 |
| 4,673,964 A | * | 6/1987 | Popovic et al. | 357/27 |
| 4,774,205 A | * | 9/1988 | Choi et al. | |
| 4,826,784 A | * | 5/1989 | Salerno et al. | 437/89 |
| 4,833,511 A | * | 5/1989 | Sugimoto | 357/19 |
| 4,872,046 A | * | 10/1989 | Morkoc et al. | 357/60 |
| 5,659,188 A | * | 8/1997 | Kao et al. | |

FOREIGN PATENT DOCUMENTS

| | | |
|---|---|---|
| JP | 632383 | 1/1988 |
| JP | 632391 | 1/1988 |
| JP | 6314418 | 1/1988 |
| JP | 63198365 | 8/1988 |

OTHER PUBLICATIONS

Milnes, 'Semiconductor Heterojunction Topics', *Solid State Electronics*, pp 99–121, vol. 29#2, 1986.*
Turner et al, 'High–Speed Photoconductive Detectors . . . ' *Materials Research Society*, vol. 67, pp. 181–188, 1986.*
Shang, 'Light Emitting Diode', IBM Tech, vol. 13#9, p. 2609, Feb. '71.*
English Abstract of Japanese unexamined patent Publication No. 63–133616 Jun., 1988.
English Abstract of Japanese Publication No. 54–131891, Oct., 1979.
RCA Review vol. 47, Dec. 1986 p. 578–605 "Organometallic Chemical Vapor Deposition of GaAs and AlGaAs for Microwave Applications".
"Dislocation Reduction in Epitaxial GaAs on Si by Thermal Cyclic Growth" Japanese Crystal Growth Institute vol. 13, No. 4 1986 pp. 43–48.

* cited by examiner

*Primary Examiner*—Stephen D. Meier
(74) *Attorney, Agent, or Firm*—Harness, Dickey & Pierce, PLC

(57) ABSTRACT

A semiconductor device possessing a semiconductor substrate consisting of a single element semiconductor; directly formed on the semiconductor substrate, a buffer layer consisting of a compound semiconductor possessing a lattice constant differing from the lattice constant of the single element semiconductor; laminated on the buffer layer, an active layer consisting of the same compound semiconductor as the buffer layer, which functions as a semiconductor element; and, disposed between the buffer layer and the active layer, a barrier layer forming a voltage barrier against the active layer so as to control the flow of current from the active layer to the semiconductor substrate: and in the case where this is utilized as a Hall element, a semiconductor device is obtained which maintains good carrier mobility as a Hall element, and also, the leakage current to the substrate can be controlled, and therefore sufficient Hall electromotive force can be obtained.

21 Claims, 9 Drawing Sheets

SEMICONDUCTOR DEVICE SUCH AS A HALL-EFFECT SENSOR OR SOLAR CELL BARRIER LAYER FOR CONTROLLING CURRENT FLOW TO SUBSTRATE

This is a continuation of application Ser. No. 07/002,550 filed Jan. 13, 1987, now U.S. Pat. No. 4,754,886, which is a continuation of application Ser. No. 07/905,142, filed on Jun. 23, 1992, now abandoned, which is a continuation of application Ser. No. 07/469,473 filed Mar. 29, 1990, now abandoned.

TECHNICAL FIELD

The present invention relates to a semiconductor device formed by epitaxial growth, on a semiconductor substrate, of a III-V Group compound differing from the substrate, and more particularly relates to Hall elements possessing the above-mentioned structure.

BACKGROUND TECHNOLOGY

In the prior art, gallium arsenide (GaAs) III-V compound semiconductors have attracted attention as Hall elements, high speed transistors, laser diodes, light emitting diodes, phototransistors, photodiodes, solar batteries and integrated circuits of such elements because of their properties of high mobility, direct transition band structure, and variability of the band gap and lattice constant by means of 3-element or 4-element compounds.

However, large diameter single crystal gallium arsenide (GaAs) wafers are not easily obtained. Furthermore, the high cost of gallium arsenide (GaAs) type semiconductors is a problem.

Furthermore GaAs is, for example, mechanically fragile compared with Si, the automatic conveyance of large diameter wafers as encountered in the Si wafer process is difficult, and automation of the manufacturing process is very difficult. Although the utility of GaAs semiconductors is recognized, this is one reason why wide industrial utilization has not been attained.

On the other hand, where electronic systems are constructed using each of the above-mentioned kinds of GaAs functionar devices, generally many Si LSI are necessary in the control circuit parts, etc. of the system. Theoretically it is not impossible to make logic IC's using GaAs, but principally because the formation of a stable insulation layer is difficult, at present there are many problems in constructing IC's comprising many diverse properties.

Because of this, if the technology were established for monolithically integrating silicon LSI and various kinds of GaAs functions on a single chip, very high function, high added value system devices could be obtained, and furthermore, production by means of an automatic line similar to that in a silicon wafer process would become possible. Needless to say, a large diameter GaAs could be inexpensively produced on a Si substrate or Si IC by using a rough blank with epitaxially grown GaAs up to the required quantity, and development of applications for GaAs could actively expand.

For example, considering the case of a Hall IC, when using a sensor such as a Hall IC it is desirable to obtain the Hall IC by integrating peripheral circuits such as waveform shaping circuits on the same chip as the Hall element. However, when a magnetic detector part is formed as an active layer from silicon, the problem is that the Hall voltage and volume sensitivity are small due to the low Hall mobility.

Hence, high sensitivity and also inexpensive Hall IC's can be produced by complexing the materials to form Hall elements from high mobility gallium arsenide (GaAs), and form other peripheral circuits from silicon.

However, because the misfit of the lattice constants of silicon and gallium arsenide is large, it has been difficult to grow gallium arsenide of good crystallinity on a silicon substrate.

The present inventors for example, found that in the case of directly growing gallium arsenide (termed GaAs below), which is one kind of a Group III-V compound semiconductor different then the substrate, on a silicon substrate (termed Si substrate below), because of the lattice misfit and the difference in thermal expansion coefficients of the GaAs layer and Si substrate, the problem exists that multiple dislocations, which is to say lattice defects, concentrate in the GaAs layer within a range of 0.5–1.0 $\mu$m from the interface of the GaAs layer and the Si substrate; furthermore, close to the interface of the GaAs and the Si substrate the carrier concentration becomes large.

In such circumstances, when the carrier concentration becomes large near the interface having concentrated lattice defects, because current is concentrated in this region, the high mobility of the gallium arsenide cannot be efficiently utilized in the active layer of gallium arsenide grown epitaxially on the silicon substrate. Here, by investigating the mobility of the GaAs layer in the vicinity of the Si substrate, the mobility of this portion of the GaAs layer has been confirmed to be very poor.

As against this, by making the film thickness of the GaAs layer thick, the crystallinity of the GaAs layer is improved, and this is thought to be a method of improving the mobility in the vicinity of the surface of the GaAs layer.

However, sufficient Hall electromotive force could not be obtained even when the GaAs layer has been made thick in a Hall element.

The object of the present invention is to make improvements in the problems of the above-mentioned prior art techniques, to improve the properties of a semiconductor device having a Group III-V compound, for example gallium arsenide (GaAs), as the active layer on a semiconductor substrate being different from the latter, and further, in the case in which the semiconductor device consisting of the above-mentioned structure is utilized as a Hall element, to provide a Hall element in which sufficient Hall electromotive force can be obtained.

DISCLOSURE OF THE INVENTION

The semiconductor device according to the present invention basically adopts a technical constitution as indicated below in order to achieve the above-mentioned objects. Namely:

A semiconductor device possessing a semiconductor substrate consisting of a single element semiconductor; directly formed on the semiconductor substrate, a buffer layer consisting of a compound semiconductor possessing a lattice constant differing from the lattice constant of the single element semiconductor; laminated on the buffer layer, an active layer consisting of the same compound semiconductor as the buffer layer, which functions as a semiconductor element; and, disposed between the buffer layer and the active layer, a barrier layer forming a voltage barrier against the active layer so as to control the flow of current from the active layer to the semiconductor substrate.

Furthermore, in another technical constitution of the semiconductor device in the present invention, it is possible to adopt a semiconductor device in which, in the semiconductor device, the above-mentioned buffer layer is absent, and which possesses a semiconductor substrate consisting of a single element semiconductor; an active layer consisting of a compound semiconductor possessing a lattice constant differing from the lattice constant of the single element semiconductor, this functioning as a semiconductor element; and, disposed between the semiconductor substrate and the active layer, a barrier layer forming a voltage barrier against the active layer so as to control the flow of current from the active layer to the semiconductor substrate.

In the semiconductor devices of the present invention, because they possess such technical constitutions, current is prevented from flowing from the semiconductor element containing the active layer to the semiconductor substrate by the barrier layer, and, because an insulating layer which is capable of making a single crystal of gallium arsenide (GaAs) and insulating the active layer consisting of gallium arsenide (GaAs) is formed on the buffer layer consisting of gallium arsenide (GaAs) formed on the silicon substrate, it is thus possible to insulate the semiconductor element containing the active layer from the high carrier concentration portion which is formed at the interface of the buffer layer and silicon substrate and it becomes possible to improve the properties of the element and to integrate it.

Further, when such semiconductor devices are utilized as Hall elements, it is possible to make the Hall element output voltage $V_H$ a voltage equivalent to the Hall voltage with which it is possible to obtain the essential characteristics of a Hall element.

DESCRIPTION OF THE PREFERRED
EMBODIMENT OF THE INVENTION

The semiconductor device of the present invention will be specifically explained below with reference to the appended Figures.

The present authors have investigated the reason for not being able to obtain sufficient Hall electromotive force in the case where a semiconductor device consisting of a semiconductor substrate consisting of a single element semiconductor, for example a silicon substrate, and a Group III-V compound semiconductor, for example gallium arsenide, different from the said semiconductor substrate, is utilized as a Hall element.

Figure 5:
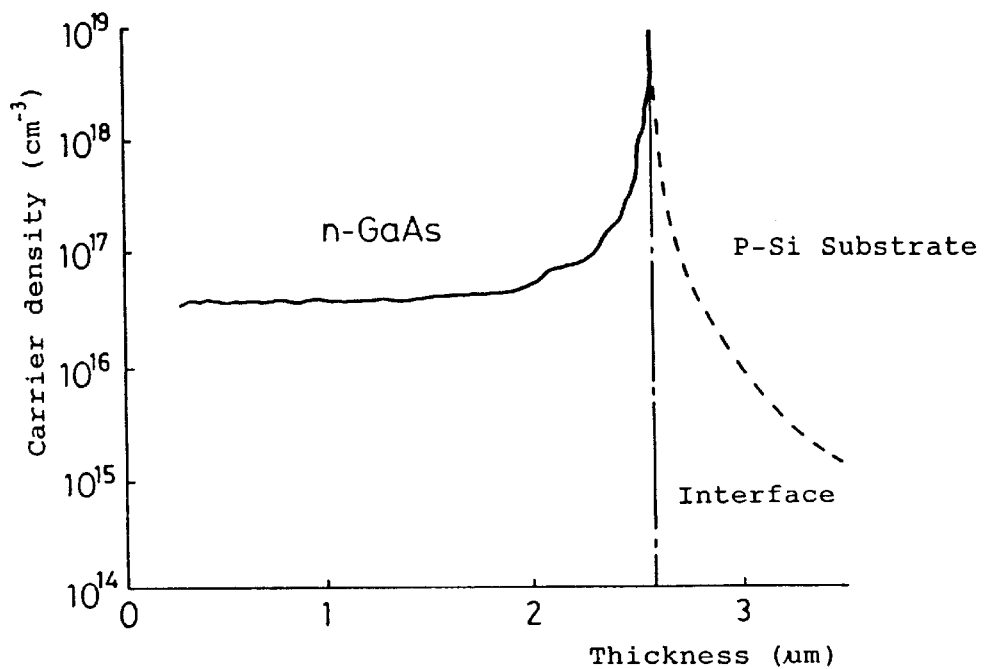
FIG. 5 is a characteristic graph showing the relationship between the carrier density and the depth from the surface of a n-GaAs layer when the n-GaAs layer is laminated onto a p-Si substrate.

For this purpose, the carrier density of a n-GaAs layer epitaxially grown directly onto a p-Si substrate was measured in relation to the distance from the interface with the Si substrate. The results are shown in FIG. 5. From this, it was found that the carrier density of the n-GaAs layer in the vicinity of the interface with the Si substrate is a maximum of $1 \times 10^{19}$ cm$^{-3}$, while at 0.75 $\mu$m from the interface on the n-GaAs side and in the vicinity of the surface it was $4 \times 10^{16}$ cm$^{-3}$. Accordingly, it was recognized that in the vicinity of the interface of the n-GaAs layer with the Si substrate a layer is formed having a carrier concentration 2 orders of magnitude greater than in the vicinity of the surface.

The presence of this layer having a high carrier concentration gives rise to the following kind of problem in a Hall element.

This problem will be explained using the equivalent circuit diagram of a Hall element in FIG. 6.

Figure 6:
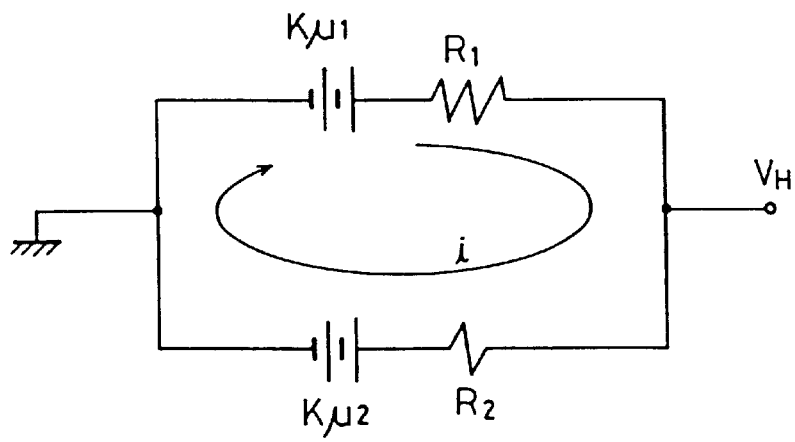
FIG. 6 is an equivalent circuit diagram of a Hall element.

In FIG. 6, $V_H$ represents the output voltage of the Hall element, $\mu_1$ and $R_1$ represent the Hall mobility and resistance of the active layer which is in the vicinity of the surface between the output electrodes; further, $\mu_2$ and $R_2$ represent the Hall mobility and resistance of the high carrier concentration layer which is in the vicinity of the interface between the GaAs layer and the Si substrate.

Then, when i is the current flowing in a closed circuit, from:

$$k_{\mu 1} - k_{\mu 2} = (R_1 + R_2)i \tag{1}$$

$$V_H - k_{\mu 1} = -iR_1 \tag{2}$$

the Hall voltage VH can be represented as $$V_H = k_{\mu I} - \frac{kR_1}{R_1 + R_2}(\mu_1 - \mu_2) \tag{3}$$

Here k is a constant of proportionality.

Furthermore, when a Hall element is formed as a GaAs layer on a Si substrate, the mobility $\mu_1$ of the active layer is greater than the mobility $\mu_2$ of the layer having a high carrier concentration. Furthermore, because this assumes an n-type high carrier concentration in the vicinity of the interface, the resistance $R_2$ becomes smaller than $R_1$.

Thus, $$\frac{kR_1}{R_1 + R_2}(\mu_1 - \mu_2)$$

has a positive value in formula (3) and it has therefore been difficult to obtain a sufficient Hall electromotive force by the formation of an n-type high carrier layer causing the Hall voltage $V_H$ of the whole body to be lower than $k_{\mu 1}$, the Hall voltage originally obtained in the active layer alone, by an amount of $$\frac{kR_1}{R_1 + R_2}(\mu_1 - \mu_2).$$

In the present invention, in a semiconductor device in which a III-V compound semiconductor is formed on, and is different from, the semiconductor substrate, and which possesses an active layer which causes a Hall voltage to develop, the semiconductor device is one in which a barrier layer is disposed between the semiconductor substrate and the active layer to prevent the flow of current from the active layer to the semiconductor substrate.

By using the above-mentioned Hall element, because current is prevented by the barrier layer from flowing into the high carrier concentration layer, the resistance $R_2$ of the high carrier concentration layer can be made infinitely large.

Because of this, as is clear from Equation (3), the Hall element output voltage $V_H$ can approach $k_{\mu 1}$ without limit, and it is sufficiently possible to obtain a Hall voltage with which it is possible to obtain the essential characteristics of a Hall element.

The semiconductor substrate 20 utilized in the present invention is formed as a single element semiconductor, and as a representative of this silicon is utilized. In the present invention, the buffer layer 14 is next directly formed on the semiconductor substrate, but the buffer layer 14 is formed from a compound semiconductor, preferably from a Group III-V compound different from the above-mentioned semiconductor substrate. Furthermore, in the present invention, the lattice constant of the compound semiconductor is preferably different from the lattice constant of the single element semiconductor from which the above-mentioned semiconductor substrate is formed.

In the present invention, gallium arsenide (GaAs) is utilized as the compound semiconductor.

By way of example, in the present invention, the lattice constant of the silicon (Si) utilized in the substrate is 5,431 Å, and further the lattice constant of the gallium arsenide (GaAs) utilized in the buffer layer or the active layer is 5,654 Å.

Furthermore, in the present invention, the active layer 16 is disposed in laminar form above the said buffer layer 14. The said active layer 16 functions as a virtual semiconductor element. The said active layer is preferably formed from the same compound semiconductor as the above-mentioned buffer layer 14, for example from gallium arsenide (GaAs).

Further, in the present invention, the voltage barrier to prevent the flow of current from the active layer to the semiconductor substrate 22, namely the barrier layer 15, is interposed as a lamina between the active layer 16 and the buffer layer 14. Which is to say, the barrier layer 15 has the function of an insulation layer which electrically insulates the active layer 16 and the buffer layer 14.

Regarding the said barrier layer 14, when for example the gallium arsenide of the compound semiconductor with the buffer layer and the active layer is of the N conductivity type, the barrier layer is preferably formed from gallium arsenide of the P conductivity type.

Further, to explain in further detail the barrier layer utilized in the present invention, the barrier layer electrically insulates the buffer layer, and is any one of (a) aluminium gallium arsenide ($Al_xGa_{1-x}As$), (b) gallium arsenide (GaAs) of a conductivity type to form a voltage barrier against the gallium arsenide (GaAs) of the active layer, (c) zinc selenide (ZnSe), or (d) a superlattice containing gallium arsenide (GaAs).

Further, there may be used as the superlattice containing gallium arsenide (GaAs), a superlattice formed from gallium arsenide (GaAs) and aluminum arsenide (AlAs), or aluminum gallium arsenide (AlGaAs), or indium gallium arsenide (InGaAs), or indium arsenide (InAs).

In the present invention, the active layer consisting of gallium arsenide (GaAs), for example as a Hall element, may be formed on the above-mentioned silicon (Si) substrate, with a drive circuit to drive the semiconductor element containing the above-mentioned active layer or a signal processing circuit to process the signal output from this semiconductor element.

Further, it is necessary for the total thickness of the buffer layer and the insulating layer to be as great as, or greater than, the thickness at which the dislocations generated from the interface terminate, and it is preferably from 1 μm to 3.5 μm. Since the lattice defects of gallium arsenide (GaAs) epitaxially grown directly on silicon reach about 1 μm from the interface, the lattice defects will not reach an active layer which has been formed.from gallium arsenide (GaAs) at a location 1 μm removed from the interface. Further, when growth on the whole surface of the Si substrate is 3.5 μm or more, or even when selective growth is performed to 7 μm or more, cracks are easily generated due to the discrepancy with the thermal expansion coefficient of silicon. In the present invention, by possessing the above-mentioned kinds of structures, as against prior art Hall elements not using barrier layers and having a mobility of only 2350±200 $cm^{-2}/V_s$, and a Hall voltage of only 74.5±12.3 mV, it is possible to obtain a mobility of 4030±198 $cm^{-2}/V_s$, and a Hall voltage of 141±13.5 mV. The form of specific embodiment examples related to the present invention is explained below, but the present invention is not limited to these embodiments alone.

EXAMPLES

Example 1

Figure 1:
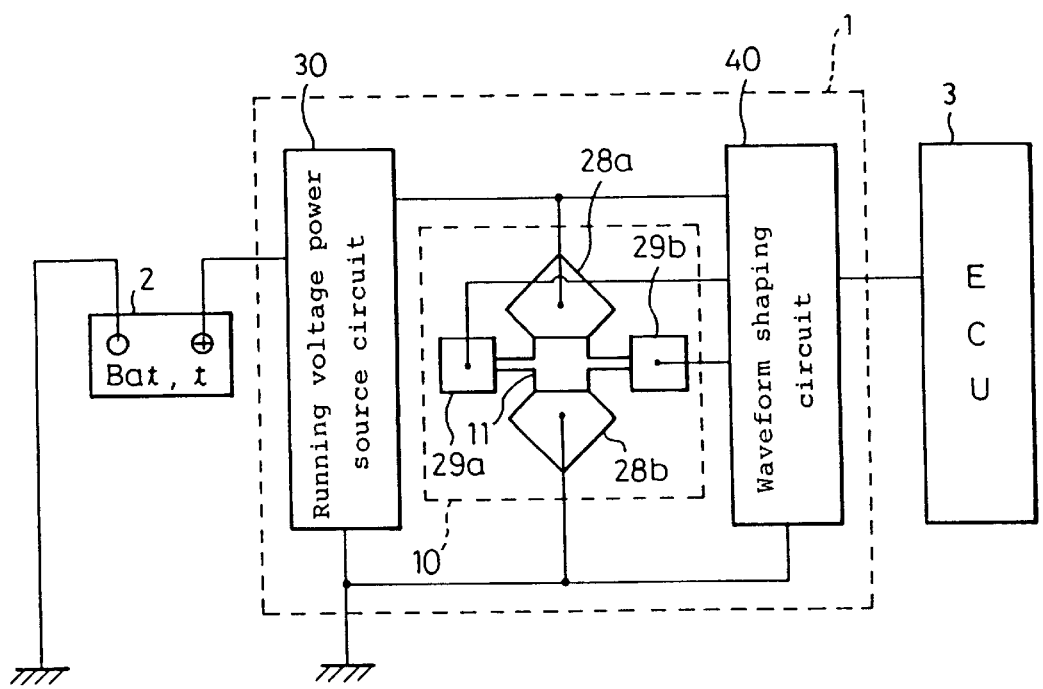
FIG. 1 is a block circuit diagram of a Hall IC in the case where a semiconductor device of the present invention is utilized as the Hall element.

Shown in FIG. 1 is an example of a Hall IC utilizing as a Hall element a semiconductor device according to the present invention. Namely, FIG. 1 shows the circuit structure of the Hall IC 1.

It is constituted by constant voltage supply circuit 30, Hall element part 10 and waveform shaping circuit 40.

The Hall element part 10 possesses a magnetic detection layer 11 consisting of gallium arsenide (GaAs), current electrodes 28a, 28b and output electrodes 29a, 29b; electricity is supplied to the electrode magnetic detection layer 11, consisting of a GaAs layer, from the constant voltage supply circuit 30 via the current electrodes 28a, 28b, and a detection signal corresponding to the detected magnetic field quantity is output to the waveform shaping circuit 40 via the output electrodes 29a, 29b. Further, the constant voltage power supply circuit 30 of the Hall IC 1 is supplied from batteries 2, and the detected signal is output from the waveform shaping circuit 40 of IC 1 to an electronic control device 3.

Figure 2:
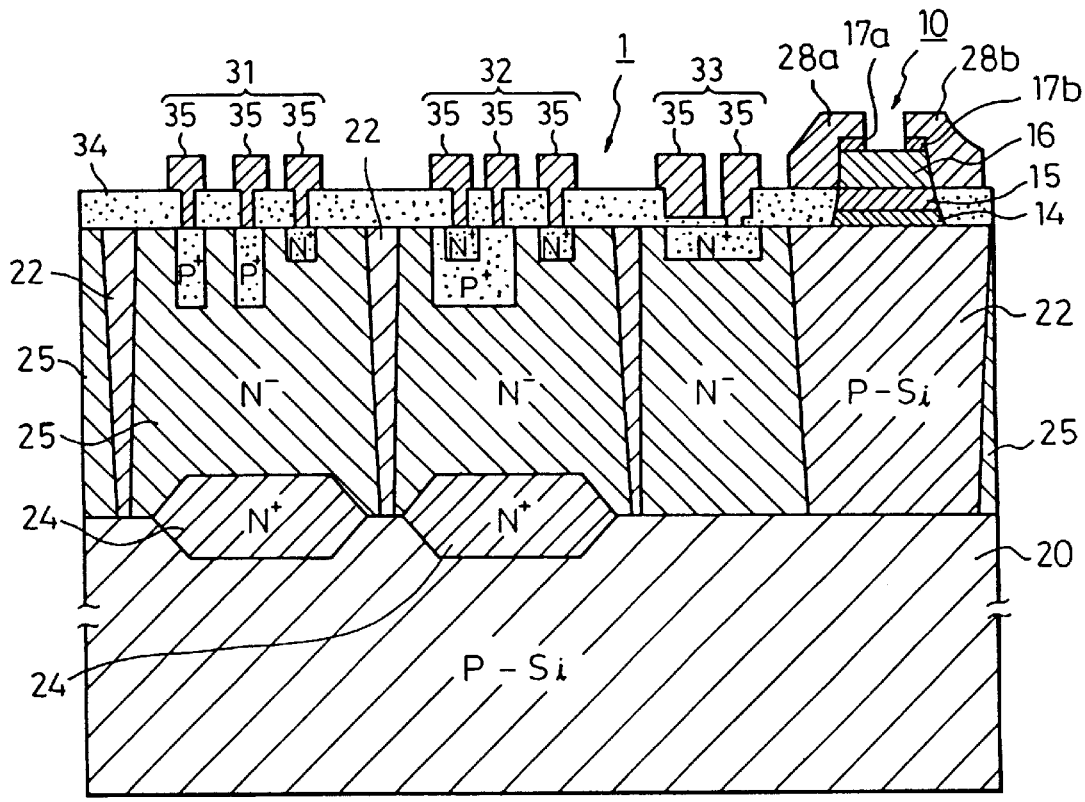
FIG. 2 is a cross section showing one embodiment of a semiconductor device of the present invention.

FIG. 2 shows the cross-sectional structure of the Hall IC 1.

The Hall IC 1 is formed on a p-Si substrate 20, but the constant voltage supply circuit 30 and the waveform shaping circuit 40 are produced by the usual Si IC production techniques.

Namely, $N^+$ buried layer 24 is formed in the surface of the p-Si substrate 20 by buried diffusion, after which $n^-$-Si is epitaxially grown on the surface of the p-Si substrate 20 and, for separation between elements, a p-type impurity is locally diffused into this epitaxial layer, forming an island-form n⁻-Si layer 25 and a p-Si separating layer 22. The impurity concentration of such a separating layer (p-Si layer) 22 is generally preferably $1 \times 10^{18}$ cm$^{-3}$ or more. P-type and n-type impurities are then diffused into the island-form n⁻-Si layer 25 in accordance with the element to be produced so forming PNP transistors 31, NPN transistors 32, MOS capacitors 33, etc., of the elements constituting the constant voltage supply circuit 30 or the waveform shaping circuit 40. Moreover, 34 is a protective film consisting of SiO$_2$, and 35 is an Al electrode.

The construction of the Hall element part 10 is next explained.

Here, a single crystal with its principal plane inclined at 4°±1° in the <011> orientation with respect to the (100) plane was used in the p-Si substrate 20. Epitaxial growth was then performed on this p-Si substrate 20, after which the Hall element 10, consisting of GaAs, was formed on the p-Si layer 22 which had been formed with the diffusion of p-type impurities.

Figure 3:
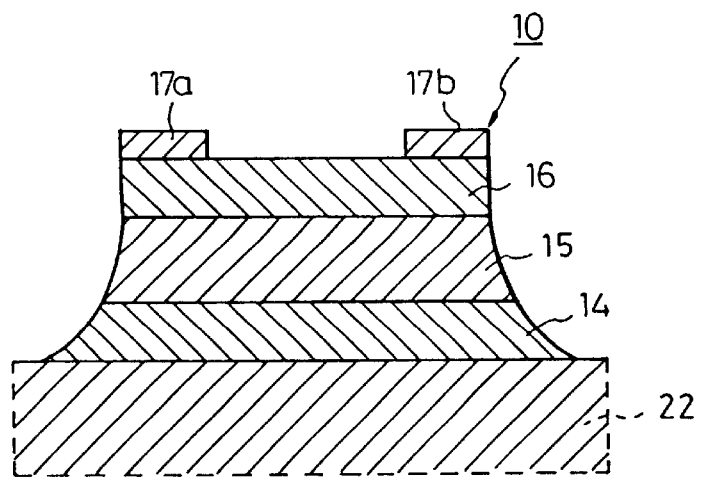
FIG. 3 is a cross section showing an embodiment of a Hall element of the present invention.

An enlarged cross section of this Hall element 10 is shown in FIG. 3.

For this Hall element 10, a high carrier concentration n⁺-GaAs layer, namely buffer layer 14, was formed in the vicinity of the interface with the p-Si layer 22.

The buffer layer, for example, was formed with a thickness of 1.0 μm. This thickness corresponded to the state in which the carrier concentration at its surface was reduced to saturation. A barrier layer 15 consisting of p-type GaAs which had been doped to an extent of about $5 \times 10^{16}$ cm$^{-3}$ with Zn was formed on the said buffer layer 14 to a thickness of 1.0 μm, and an n-GaAs layer 16, which was an active layer which had been doped to an extent of about $2 \times 10^{17}$ cm$^{-3}$ with Si, was further formed on this to a thickness of 1.0 μm. Ohmic electrodes 17a, 17b of Au/Au—Ge were then formed. In this example, the active layer 16 became the magnetically sensitive layer of the Hall element. The current electrodes 28a, 28b were then formed of Au/Ni/Au—Ge on the above-mentioned electrodes 17a, 17b.

Each of these layers was formed by epitaxial growth in sequence and continuously using an organometallic thermal vapor phase growth method (MOCVD). The gaseous raw materials were trimethylgallium (TMG, Ga(CH$_3$)$_3$), hydrogen-diluted arsine (AsH$_3$). Further, among n-type and p-type dopants, hydrogen-diluted SiH$_4$ and DEZ were used. The rate of flow of these gases was accurately controlled by means of a flow quantity control device to obtain a fixed rate of crystal growth, which was set at 4.6 μm/h. The growth temperature was 750° C. In growing the buffer layer consisting of GaAs on the p-Si layer 22, after a ca. 200 Å layer of GaAs had been grown at 450° C., growth was performed at 750° C. by means of a 2-stage growth method as disclosed in Japanese Unexamined Patent Publication (Kokai) No. 63-133616.

By using such a 2-stage growth method, defects such as lattice deformation, dislocations, etc. formed in the buffer layer were covered.

This produces a Hall IC constructed of a GaAs-based semiconductor for which the Hall element portion 10 has been epitaxially grown on the p-Si layer 22, and constructed of a Si semiconductor for which other peripheral circuits have been formed on the same p-Si substrate 20.

The operation of the Hall element 10 of the present embodiment example is next explained. Current flows to the current electrodes 28a, 28b of this Hall element 10 and a magnetic flux is applied in the direction of this current and in the perpendicular direction. Thereupon a Hall element output voltage V$_H$ occurs between the output electrodes 29a, 29b due to the Hall effect.

Because a barrier layer, the p-GaAs layer 15, is disposed between the high carrier concentration layer, the n⁺-GaAs layer 14, and the active layer, the n-GaAs layer 16, in the vicinity of the Si substance and the GaAs layer, the flow of current from the n-GaAs layer 16 into the n⁺-GaAs layer 14 can be prevented by means of the barrier due to the diffusion voltage of the p-GaAs layer 15.

The flow of current from the n-GaAs layer 16 into the n⁺-GaAs layer 14 is prevented due to the formation of a diffusion voltage of 0.5 to 1.2 V owing to pn junctions between the n-GaAs layer 16 and the p-GaAs layer 15.

This prevention of the flow of current into the n⁺-GaAs layer 14 is the same as making the resistance R$_2$ of the high carrier concentration layer in the equivalent circuit diagram of FIG. 6 infinitely large; the term $$\frac{kR_1}{R_1 + R_2}(\mu_1 - \mu_2)$$

of Equation (3) practically approaches zero, and the Hall output voltage V$_H$ can approach k$_{\mu 1}$ without limitation.

In the present embodiment, the result of measuring the mobility μ of the whole Hall element which is proportional to the output voltage V$_H$ of the hall element, a high mobility μ of 4500 cm$^{-2}$/V.S can be obtained.

By means of the Hall element of this embodiment a mobility can be obtained which is about 2 times the mobility of the Hall element, 2200 cm$^{-2}$/V.S, in the case when a film thickness of 3 μm of GaAs is formed without the formation of the p-GaAs layer 15 which is the barrier layer.

Example 2

Figure 4:
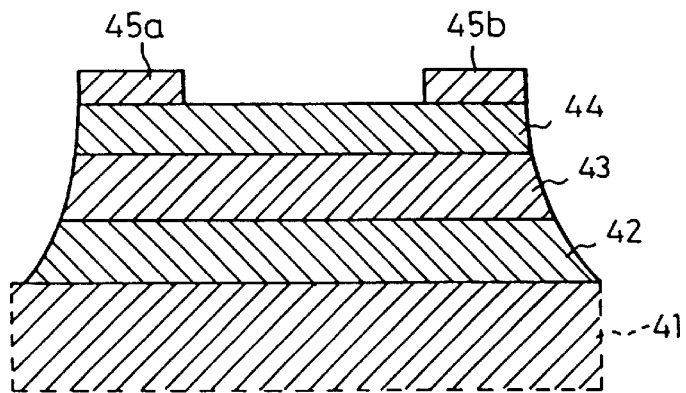
FIG. 4 is a cross section showing another embodiment of a Hall element of the present invention.

Another example of the present invention is shown in FIG. 4. Instead of the p-GaAs layer 15 in the first embodiment, an n⁻-GaAs layer 43 is inserted, and a voltage barrier due to the n-n⁻ junction is utilized which makes it possible to improve the properties of the Hall element. For example, on a p-Si substrate, when an n⁺-GaAs layer (film thickness: 1 μm), an n⁻-GaAs layer (n=2×10 cm$^{-3}$, film thickness: 1 μm), and an n-GaAs layer (n=2×10$^{17}$ cm$^{-3}$, film thickness: 1 μm) were formed, the mobility was 3900 cm$^2$/V.S, which was about 1.8 times that for the case when an n⁻-GaAs layer 43 was not inserted (film thickness 3 μm, Hall mobility: 2200 cm$^2$/V.S). Since the mobility is proportional to the Hall voltage V$_H$, it will be recognized that a high Hall voltage was obtained in this example.

Figure 9:
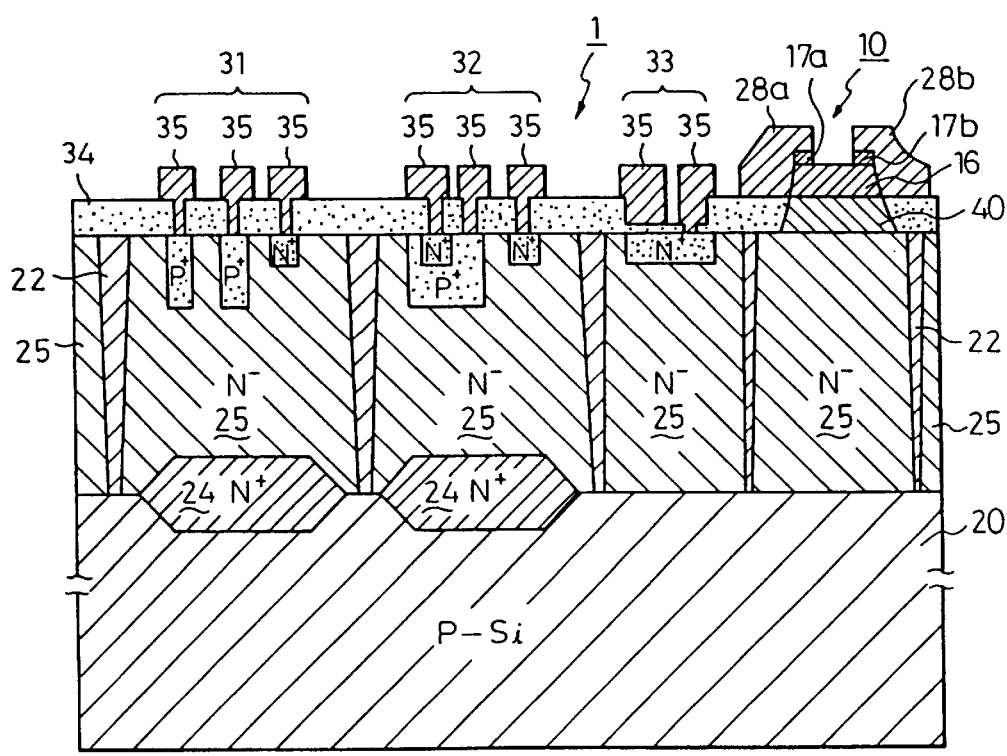
FIG. 9 is a cross section showing another embodiment of a semiconductor device of the present invention.

In the above-mentioned example, the barrier layer of p-GaAs 15 is formed on the p-Si layer 22, with the high carrier concentration n⁺-GaAs layer 14 interposed, but the p-GaAs layer 15 may also be formed in direct contact on the p-Si layer 22. An example of such a structure is shown in FIG. 9. Namely, in FIG. 9, instead of forming the epitaxial growth part 22 of p-Si it is formed of n⁻-Si on the p-Si substrate 20 to form the Hall element part in FIG. 2, and on this, for example, a semi-insulating line of GaAs layer 40 is formed, and on this an active layer 16 is formed. The GaAs layer 40 corresponds to the barrier layer in Example 1. Anything may be used for such a layer 40, provided it forms a voltage barrier against the active layer 16, but it is difficult to form a p-GaAs layer on the Si substrate, as in the above-mentioned embodiment example, so that one made as mentioned above is preferable.

In the above Examples 1 and 2, the Hall element consisting of GaAs is formed on a Si substrate, but the Hall element is not limited to GaAs, and the Hall element may also consist of InSb, InAs, and the like Group III–V compounds; moreover, there is no limitation to a Si substrate.

A p-GaAs layer is utilized as the respective barrier layer in Embodiment Examples 1 and 2, but examples are disclosed below in which the barrier layer is constructed of compound semiconductors.

Example 3

The buffer layer 13 consisting of GaAs in Example 1 was formed with a thickness of 0.5 μm, and instead of p-GaAs for the barrier layer 15, a barrier layer of aluminum gallium arsenide ($Al_{0.3}Ga_{0.7}As$) was formed with a thickness of 0.5 μm, and furthermore an active layer 16 of n-GaAs, 1.5 μm thick, was formed on this.

With such Hall IC's as in Example 1, a Hall IC is obtained which is constructed of a GaAs-based semiconductor with the Hall element 10 epitaxially grown on the p-Si substrate 20, and constructed of the Si semiconductor with other peripheral circuits formed on the same p-Si substrate 20, and this Hall IC has the same characteristics as those constructed of a GaAs-based semiconductor alone.

Figure 7:
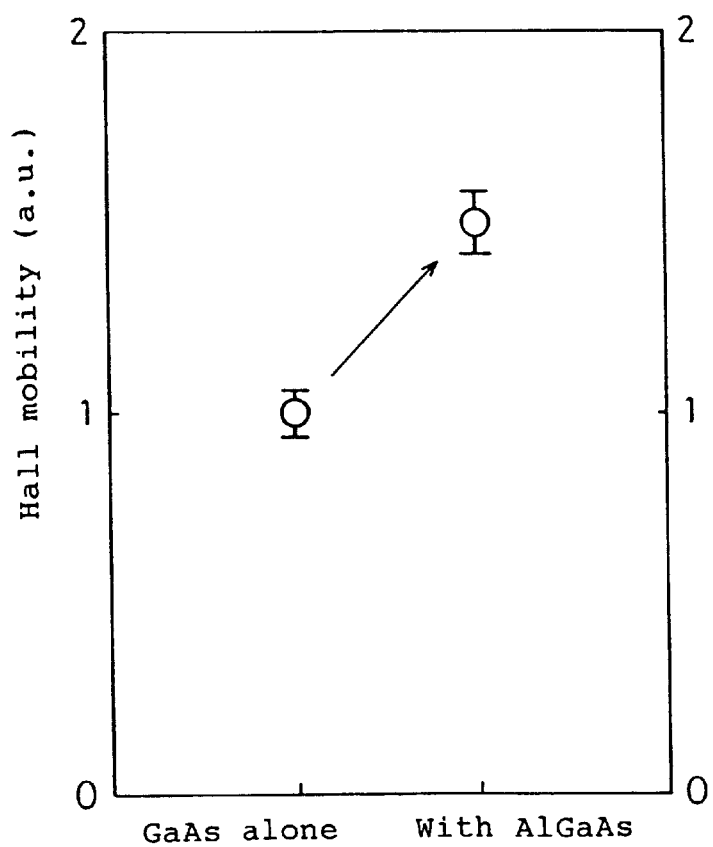
FIG. 7 is a figure showing measurement results for Hall mobility.

Further, to confirm the effect of the $Al_{0.3}Ga_{0.7}As$ barrier layer 15 which is a distinctive feature of this example, measurements were made of the Hall mobility of the active layer 16 consisting of n-GaAs in the Hall element part 10, and of the Hall mobility of a n-GaAs layer epitaxially grown directly onto the p-Si substrate without formation of the interposed barrier layer 15 consisting of $Al_{0.3}Ga_{0.7}As$. In the results, as can be seen from FIG. 7, the Hall mobility was 1.6 times greater when the barrier layer 15, of this embodiment, consisting of $Al_{0.3}Ga_{0.7}As$ was interposed than when no barrier layer 15 consisting of $Al_{0.3}Ga_{0.7}As$ was interposed. This result shows that the detection sensitivity of the Hall element with a barrier layer 15 of $Al_{0.3}Ga_{0.7}As$ interposed becomes 1.6 times that in the case when a barrier layer 15 of $Al_{0.3}Ga_{0.7}As$ is not interposed.

Further, the cross section of an n-GaAs layer epitaxially grown directly onto a p-Si substrate was investigated with a transmission electron microscope, and as a result it was judged that many transitions occurred up to about 0.5–1.0 μm from the Si interface. From this fact, to the degree that these transitions fall short of the active layer 16 composed of GaAs, it is considered preferable that the buffer layer 14 consisting of GaAs and the barrier layer 15 consisting of $Al_{0.3}Ga_{0.7}As$ have a thickness totalling 1 μm or more.

Accordingly, in this example, by interposition of the barrier layer 15 consisting of $Al_{0.3}Ga_{0.7}As$ between the buffer layer 14 consisting of GaAs and the n-GaAs layer 16 as the Hall element, the sensitivity of the Hall element is increased by insulating the region of high carrier density in the vicinity of the interface from the n-GaAs layer 16.

Moreover, the mixed crystal ratio x in the barrier layer 15 consisting of $Al_xGa_{1-x}As$ is 0.3 in the above example, but the value of the mixed crystal ratio x may fall in the range 0<x<1, as long as insulation is preserved and the epitaxial growth of the n-GaAs layer 16 is satisfactory.

Example 4

Instead of the formation, in the above-mentioned Example 3, of the barrier layer 15 consisting of $Al_{0.3}Ga_{0.7}As$ in an epitaxial growth process by MOCVD, diethylzinc may be used as a p-type dopant to form a p-GaAs layer about 1 μm thick and the active layer 16 consisting of n-GaAs may be formed on this. In this case, the active layer 16 is insulated from the buffer layer 14 by the PN junction, together with which, as the same GaAs layers are grown in sequence from the buffer layer 14, the crystallinity of the active layer 16 is good, and the effects obtained were similar to those of Example 3.

Example 5

Instead of the formation, in the above-mentioned Example 3, of the barrier layer 15 consisting of $Al_{0.3}Ga_{0.7}As$ in an epitaxial growth process by MOCVD, a ZnSe layer was grown epitaxially. ZnSe conforms well to the GaAs lattice, and furthermore because of the wide forbidden band, of width 2.6 eV, insulation against the buffer layer 14 is good. Effects obtained were similar to those of Example 3.

Example 6

Instead of the formation, in the above-mentioned Example 3, of the barrier layer 15 consisting of $Al_{0.3}Ga_{0.7}As$ in an epitaxial growth process by MOCVD, a superlattice of AlAs and GaAs was laminated to form the barrier layer. This Hall IC also gave effects similar to those of Example 3.

Example 7

Figure 8:
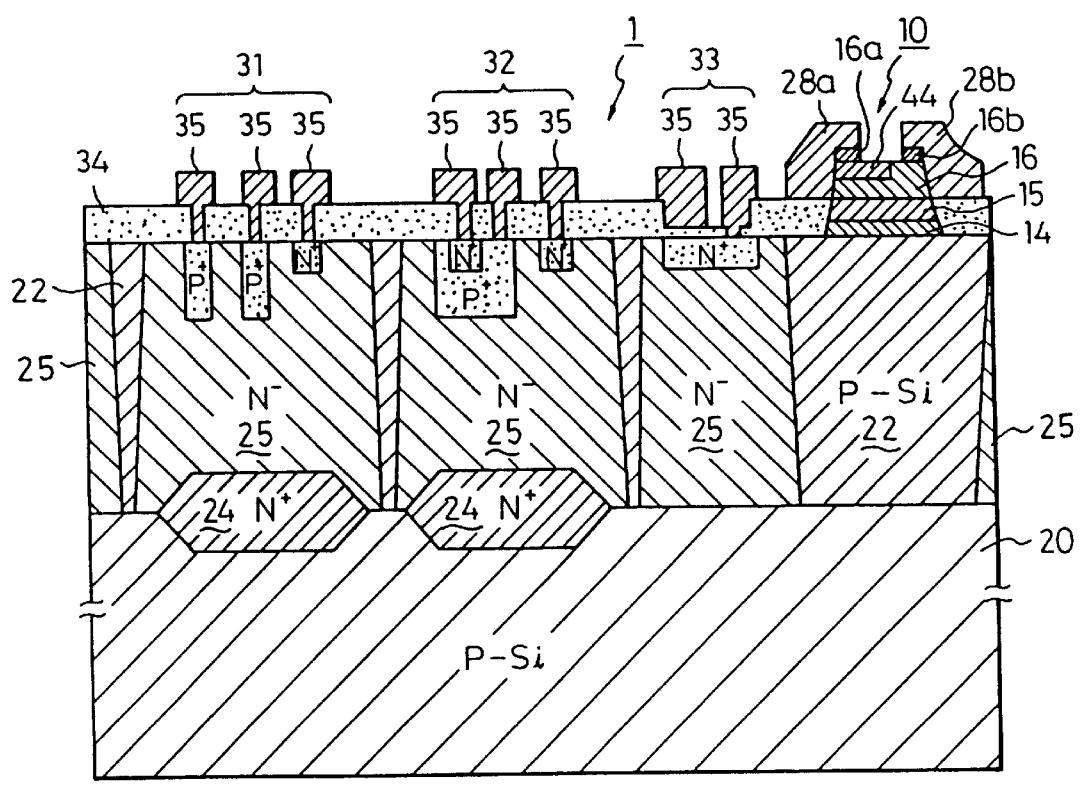
FIG. 8 is a cross section showing another embodiment of a semiconductor device of the present invention.

This example shows a solar battery IC; its cross-sectional structure is shown in FIG. 8. Portions with functions the same as in Example 1 are given the same reference numbers.

Formation was carried out similarly to Example 1 up to the formation of the active layer 16 consisting of n-GaAs, after which the p-GaAs layer 44 was formed using a p-type dopant on a portion of the active layer 16 consisting of n-GaAs; furthermore, an electrode layer 16b consisting of $n^+$-GaAs formed a junction with the active layer 16 consisting of n-GaAs, and an electrode layer 16a consisting of $P^+$-GaAs formed a junction with the p-GaAs layer 44. Other peripheral circuits were similar to those of Example 1. In this case, the active layer 16 consisting of a n-GaAs layer and the p-GaAs layer 44 constitute a solar battery semiconductor element. A solar battery IC constructed in this manner shows good characteristics.

Other than the above various examples, similarly a laser diode or the like may be constructed by formation of a GaAs type semiconductor double heterojunction layer on an active layer 16 consisting of n-GaAs, and the driving circuit may be formed on the same Si substrate as a peripheral circuit.

In the above examples, in order to form a composite IC with other functional elements, GaAs and the like was epitaxially grown on the epitaxially grown p-Si layer 22 as the Si substrate, but GaAs and the like may also be epitaxially grown on the present single crystal Si substrate.

Example 8

Figure 10:
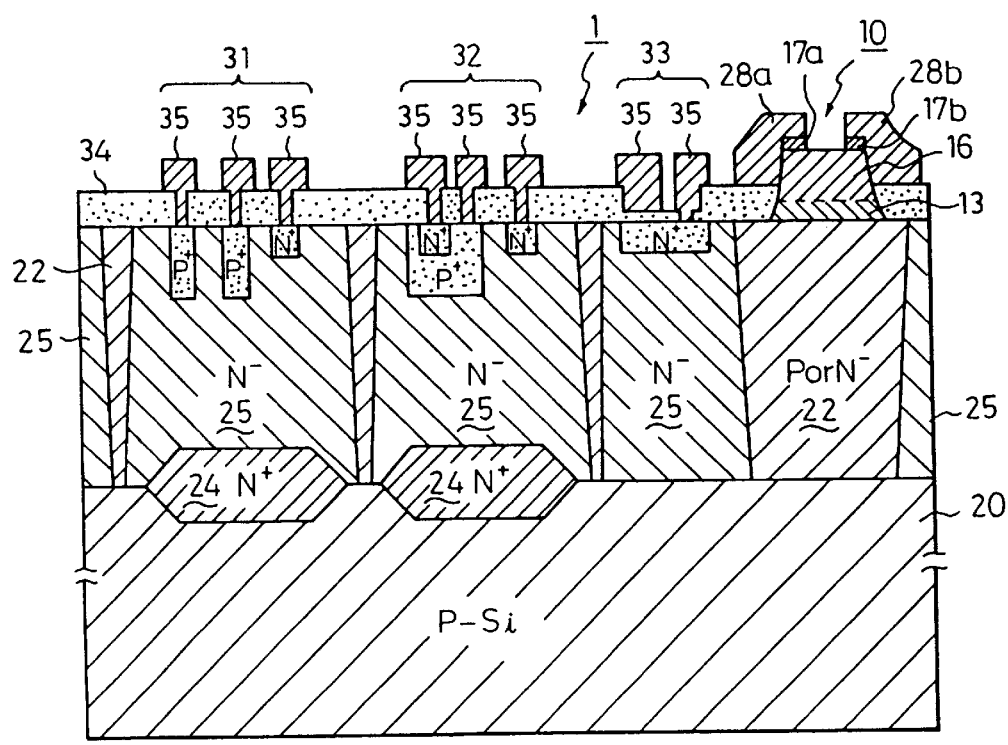
FIG. 10 is a cross section of a semiconductor device showing a case in which the active layer is formed directly on the substrate without using a barrier layer or a buffer layer.

In the above embodiments, in order to control the flow of current from the active layer 16 to the Si substrate 22, a buffer layer 14 or barrier layer 15, or both, are interposed between the active layer 16 and the Si substrate 22. Incidentally, a Hall IC with little voltage resistance was obtained when the present inventors produced a Si bipolar Hall IC as shown in FIG. 10 to settle topics related to the present invention, in research and development for the obtention of a GaAs/p-Si heterojunction semiconductor device which would allow efficient and inexpensive production of combined integrated circuits in which various circuits including a Hall element have been combined on a single substrate.

Figure 11:
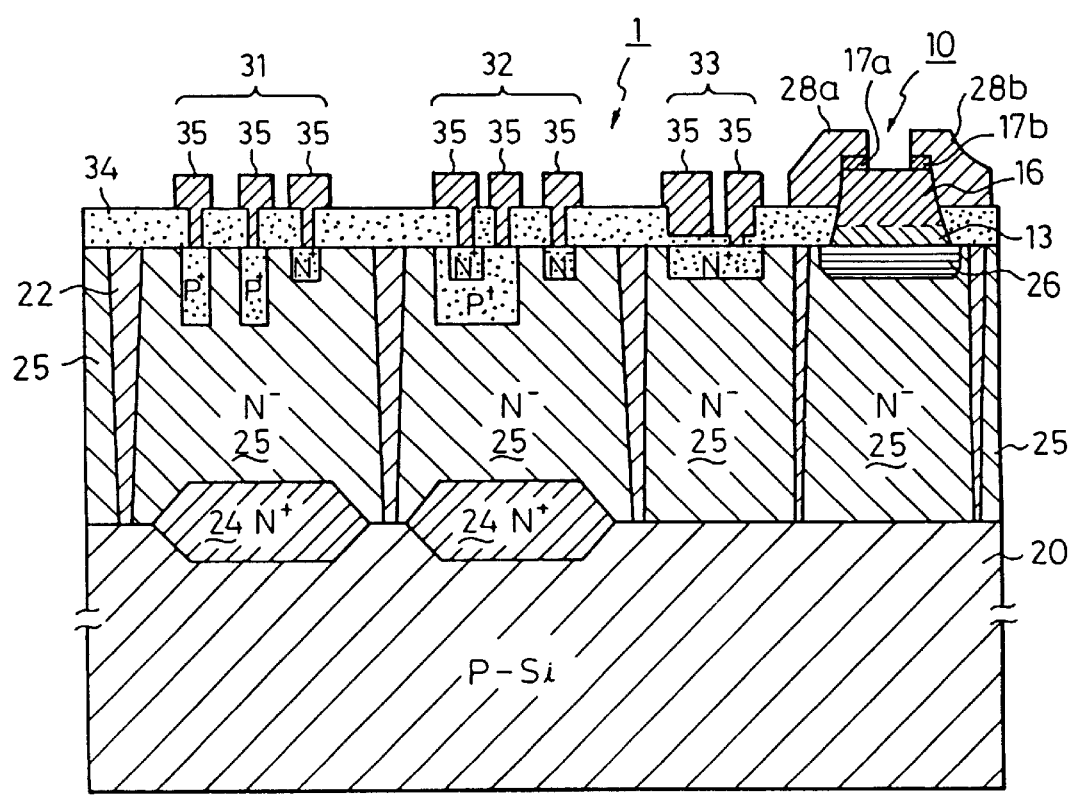
FIG. 11 is a cross section showing a further embodiment of a semiconductor device of the present invention.

Regarding the cause of this, there was proved to be formation of a $n^+$-GaAs layer (13) about 0.5–1.0 μm thick, with many defects, at the GaAs/Si interface, and it was therefore considered that, even with the formation only singly of a GaAs element on the Si substrate, it would not be possible to apply the requisite voltage since a leakage current flows owing to a diode effect or a tunnel effect and the withstand voltage is not achieved regardless of whether the Si between the n$^+$-GaAs and the Si was of the n-type or p-type. As shown in FIG. 11, the present inventors adopted an n-type Si layer 25 as the Si substrate for forming the n$^+$-GaAs layer, and formed a p-Si layer (26) by the ion injection of trivalent impurities such as boron in the region of formation of the said n$^+$-GaAs layer on the said Si substrate. In such a p-Si layer, the carrier density is of the order of $10^{16}$–$10^{17}$ cm$^{-3}$, and the thickness of this layer was 1.5 μm or more.

Figure 12:
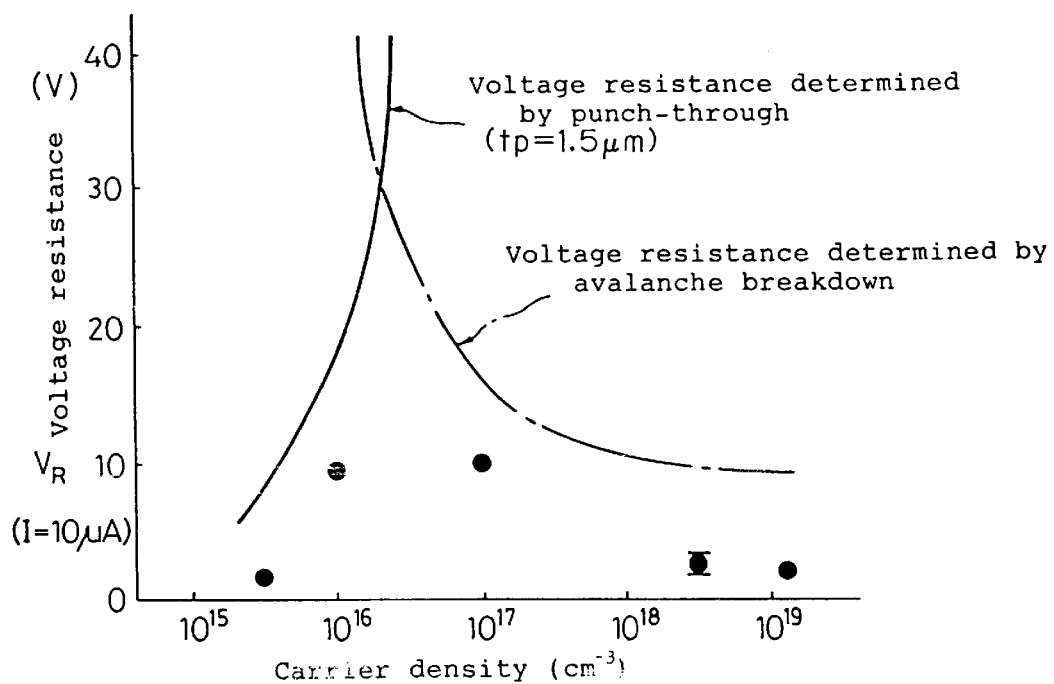
FIG. 12 is a graph show the relationship between the carrier density of the p-Si substrate (thickness 1.5 $\mu$m) and the voltage resistance in the semiconductor device of FIG. 11.

The relationship between carrier density and voltage resistance in such n$^+$-GaAs/p-Si layers is shown in FIG. 12, from which it is clear that even if there is a n$^+$-GaAs layer with a high concentration of $1 \times 10^{19}$ (cm$^{-3}$) at the interface of the heterojunction structure, a withstand voltage of 10 V or more is obtained if the carrier density of the above-mentioned p-Si layer is $10^{16}$ to $10^{17}$ cm$^{-3}$. Accordingly, this withstands use adequately even at an applied voltage $V_c$ of 4.3 (V) in the GaAs Hall element.

In this example, the barrier layer 15 and/or the buffer layer 14 in particular are not formed between the active layer 16 and the Si substrate, but by the formation of such layers the above-mentioned effects can be increased still more.

Further, in this example, as the process for forming the p-Si layer (26), impurity doping is performed by boron injection, and the activation annealing treatment which follows this can be performed utilizing thermal excitation in a Si bipolar IC process in a later stage. The technique of such an example is a very important technique when industrially producing complex integrated circuits containing Hall elements.

What is claimed is:

1. A semiconductor device comprising:
    a semiconductor substrate consisting of a single element semiconductor;
    a buffer layer, directly formed on said semiconductor substrate, said buffer layer consisting of a compound semiconductor possessing a lattice constant differing from a lattice constant of said single element semiconductor and a high carrier concentration portion formed by a substrate composing substance transferred thereinto from said substrate, said buffer layer having a film thickness sufficient to reduce and stabilize a distribution of said carrier concentration of said high carrier concentration portion;
    active layer means disposed on said buffer layer, for functioning as a semiconductor element to convert and amplify a physical value to be measured, said active layer means including the same compound semiconductor as said buffer layer;
    electrode means serving as an electrode connected to said semiconductor element of said active layer means; and
    barrier layer means disposed between said buffer layer and said active layer means for forming a voltage barrier against said active layer means to control an electric current flowing into said high carrier concentration portion from said electrode means to said high carrier concentration portion of said buffer layer.

2. Semiconductor device of claim 1, characterized in that said single element semiconductor is silicon, and said compound semiconductor is a Group III-V compound semiconductor different from silicon.

3. Semiconductor device of claim 1, characterized in that said single element semiconductor is silicon, and said compound semiconductor is gallium arsenide (GaAs).

4. Semiconductor device of claim 3, characterized in that the compound semiconductor of said buffer layer and said active layer means is N conductivity type gallium arsenide, and said barrier layer means is P conductivity type gallium arsenide.

5. Semiconductor device of claim 1, characterized in that the total thickness of said buffer layer and said barrier layer means is equal to or greater than the thickness at which dislocations which are produced from the interface of said semiconductor substrate and said buffer layer terminate.

6. Semiconductor device of claim 5, characterized in that the total thickness of said buffer layer and said barrier layer means is in a range of 1–7.0 μm from the interface of said semiconductor substrate and said buffer layer.

7. Semiconductor device of claim 1, characterized in that said active layer means is a Hall element.

8. Semiconductor device off claim 1, characterized in that there is formed on said semiconductor substrate at least one circuit selected from a drive circuit which drives said semiconductor element which contains the active layer ,and a signal processing circuit which processes the signal output from said semiconductor element.

9. Semiconductor device of claim 1, characterized in that said barrier layer means is formed from an aluminum gallium arsenide represented by $Al_xGa_{1-x}As$.

10. Semiconductor device of claim 9, characterized in that the mixed crystal ratio X is within the range 0<X<1.

11. Semiconductor device of claim 1, wherein said compound layer and buffer layer are both gallium arsenide (GaAs) and said barrier layer means is formed from a conductivity type of gallium arsenide (GaAs) which forms a voltage barrier against the gallium arsenide (GaAs) of said active layer means.

12. Semiconductor device of claim 1, characterized in that said barrier layer means is formed from zinc selenide (ZnSe).

13. Semiconductor device of claim 1, characterized in that said barrier layer means is formed from a superlattice containing gallium arsenide (GaAs).

14. Semiconductor device of claim 13, characterized in that said superlattice containing gallium arsenide (GaAs) is a superlattice consisting of a compound semiconductor containing gallium arsenide (GaAs) and galliumor arsenic.

15. Semiconductor device of claim 14, characterized in that said compound semiconductor containing gallium or arsenic consists of AlAs, AlGaAs, InGaAs, or InAs.

16. A semiconductor device as in claim 1 wherein said semiconductor device is a Hall element, and said active layer is the magnetically sensitive layer means of the Hall element.

17. Semiconductor device comprising:
    a semiconductor substrate consisting of a single element semiconductor;
    active layer means for functioning as a semiconductor element to convert and amplify a physical value to be measured, said active layer means consisting of a compound semiconductor possessing a lattice constant differing from a lattice constant of said single element semiconductor;
    barrier layer means for forming a voltage barrier against said active layer so as to control an electrical current flowing from said active layer to said semiconductor substrate, said barrier layer means being disposed between said semiconductor substrate and said active layer means and constituting an isolation layer therebetween; and wherein said compound semiconductor in said active layer is formed by a MOVCD method.

18. Semiconductor device of claim 17, characterized in that said single element semiconductor is silicon, and said compound semiconductor is a Group III-V compound different from said semiconductor substrate.

19. Semiconductor device of claim 17, characterized in that said single element semiconductor is silicon, and said compound semiconductor is gallium arsenide (GaAs).

20. A semiconductor device as in claim 17 wherein said semiconductor device is a Hall element, and said active layer is the magnetically sensitive layer means of the Hall element.

21. A semiconductor device comprising:

a semiconductor substrate consisting to a single element semiconductor;

a buffer layer, directly formed on said semiconductor substrate, said buffer layer consisting of a compound semiconductor possessing a lattice constant differing from a lattice constant of said single element semiconductor and a high carrier concentration portion formed by a substrate composing substance transferred thereinto from said substrate, said buffer layer having a film thickness sufficient to reduce and stabilize a distribution of said carrier concentration of said high carrier concentration portion;

active layer means disposed on said buffer layer, for functioning as a semiconductor element to convert and amplify a physical value to be measured, said active layer means including the same compound semiconductor as said buffer layer;

electrode means serving as an electrode connected to said semiconductor element of said active layer means;

barrier layer means disposed between said buffer layer and said active layer means for forming a voltage barrier against said active layer means to control an electric current flowing into said high carrier concentration portion from said electrode means to said high carrier concentration portion of said buffer layer;

wherein said compound semiconductor in said barrier layer is formed using a MOVCD method; and said active layer is used as a semiconductor element layer through which a current can flow in parallel with said semiconductor substrate.

* * * * *

UNITED STATES PATENT AND TRADEMARK OFFICE
CERTIFICATE OF CORRECTION

PATENT NO. : 6,559,480 B1  
DATED : May 6, 2003  
INVENTOR(S) : Hajime Inuzuka et al.

Page 1 of 1

It is certified that error appears in the above-identified patent and that said Letters Patent is hereby corrected as shown below:

Title page,
Item [63], Related U.S. Application, "application No. 07/002,550, filed Jan. 13, 1987, now Pat. No. 4,754,886" should be -- application No. 08/002,550, filed Jan. 11, 1993 --
Item [30], Foreign Application Priority Data, add priority claim
-- PCT/JP89/00458    5/01/1989 --

Column 11,
Line 63, after "layer" insert -- wherein said compound semiconductor in said buffer layer is formed by a MOVCD method --

Column 12,
Line 20, "off" should be -- of --

Signed and Sealed this

Twenty-eighth Day of June, 2005

JON W. DUDAS
*Director of the United States Patent and Trademark Office*